United States Patent [19]
Kaplounenko et al.

[11] Patent Number: 5,963,351
[45] Date of Patent: Oct. 5, 1999

[54] DIGITAL OPTICAL RECEIVER WITH INSTANTANEOUS JOSEPHSON CLOCK RECOVERY CIRCUIT

[75] Inventors: Vsevolod Kaplounenko, Cupertino; Noshir B. Dubash; Yongming Zhang, both of Sunnyvale, all of Calif.; Uttam Goshal, Austin, Tex.

[73] Assignee: Conductus, Inc., Sunnyvale, Calif.

[21] Appl. No.: 08/841,730

[22] Filed: Apr. 29, 1997

Related U.S. Application Data

[60] Provisional application No. 60/023,910, Aug. 23, 1996.

[51] Int. Cl.$^6$ .................................................. H04B 10/00
[52] U.S. Cl. .......................... 359/158; 359/138; 375/371; 329/346
[58] Field of Search .................................... 359/135, 138, 359/158, 189, 195; 375/326, 371; 329/306, 307, 345, 346

[56] References Cited

U.S. PATENT DOCUMENTS

| | | | |
|---|---|---|---|
| 4,749,888 | 6/1988 | Sakai et al. | |
| 4,980,891 | 12/1990 | Izadpanah | 372/25 |
| 5,459,607 | 10/1995 | Fellows et al. | 359/138 |
| 5,706,113 | 1/1998 | Kawanishi et al. | 359/158 |

OTHER PUBLICATIONS

Izadpanah, H., "Direct Timing Extraction in a Modified–Manchester Coded Picosecond Optical Pulse Fibre Optic Transmission System," *Electronics Letters*, 24(18):1151–1153 (Sep. 1, 1988).

Kaplunenko, V. et al., "Superconducting single flux quantum 20 Gb/s clock recovery circuit," *Appl. Phys. Lett.*, 71(1):128–130 (Jul. 7, 1997).

Andersson et al., Silicon Bipolar Chipset for SONET/SDH 10 Gb/s Fiber–Optic Communication Links, *IEEE Journal of Solid–State Circuits*, 30, pp. 210–218, Mar. 1995.

Goldobin et al., Direct Determination of the Ultimate Performance of the RSFQ Digital Devices and Single Flux Quantum Voltage Amplifiers, *IEEE Transactions on Applied Superconductivity*, 3, pp. 2641–2644, Mar. 1993.

Likharev et al., RSFQ Logic/Memory Family: A New Josephson–Junction Technology for Sub–Terahertz–Clock–Frequency Digital Systems, *IEEE Transactions on Applied Superconductivity*, 1, pp. 3–27, Mar. 1991.

Mukhanov et al., Josephson Output Interfaces for RSFQ Circuits, *IEEE Transactions on Applied Superconductivity*, vol. 7, pp. 2826–2831, Jun. 1997 (presented at a conference in Aug., 1996).

Razavi, A 2.5 Gb/s 15–mW Clock Recovery Circuit, *IEEE Journal of Solid–State Circuits*, vol. 31, pp. 472–480, Apr. 1996.

Yu et al., An All–Niobium Eight Level Process for Small and Medium Scale Applications, *IEEE Transactions on Magnetics*, vol. MAG–23, pp. 1476–1479, Mar. 1987.

Zhang et al., Cryogenic Performance of a High–Speed GaInAs/InP p–i–n Photodiode, *Journal of Lightwave Technology*, vol. 15, pp. 529–533, Mar. 1997.

Likharev, Ultrafast Superconductor Digital Electronics: RSFQ Technology Roadmap, *Proc. of 21st Int'l Conf. on Low Temp. Physics*, vol. 6, p. 3331, Aug. 1996.

"Niobium Design Rules" from Hypres, Inc. (Elmsford, N.Y.), available at www.hypres.com.

*Primary Examiner*—Rafael Bacares
*Attorney, Agent, or Firm*—Merchant & Gould P.C.

[57] ABSTRACT

A digital optical receiver and clock recovery circuit for use in detecting and retiming optical data transmitted at rates up to and exceeding 40 Gb/s. The receiver is made, in part, of superconducting Josephson junctions. The receiver includes an optical signal detector, an SFQ (single flux quantum) transition detector for converting the signal from the photodetector into a stream of single flux quantum signals, and a clock recovery circuit. The clock recovery circuit includes a superconducting ring oscillator in which an SFQ pulse rotates and provides a clock signal at an output of the oscillator. When a pulse from the stream of single flux quantum pulses arrives from the transition detector, two pulses are generated in the ring oscillator. One of the pulses eliminates the rotating SFQ pulse and the second pulse replaces the rotating SFQ pulse, thereby recovering the phase of the clock signal in one bit.

28 Claims, 13 Drawing Sheets

RSFQ SELF TIMED DEMULTIPLEXER

1:2 DEMUX

DIGITAL OPTICAL RECEIVER WITH INSTANTANEOUS JOSEPHSON CLOCK RECOVERY CIRCUIT

This application claims the benefit of U.S. Provisional application Ser. No. 60/023,910 filed on Aug. 23, 1996.

STATEMENT OF GOVERNMENT INTEREST

This invention was made with United States Government support under ATP award No. 70NANB2H1238, awarded by the Department of Commerce. The United States Government has certain rights in this invention.

FIELD OF THE INVENTION

The present invention relates generally to an optical receiver, and more particularly to a digital optical receiver having an instantaneous clock recovery circuit utilizing Josephson junctions.

BACKGROUND OF THE INVENTION

There is increasing demand for high-speed fiber-optic transmission of data. Advanced technologies such as 100 Gb/s optical time-multiplexed (OTDM) networks are driving the need for high-speed optical receivers. The performance of analog clock-recovery circuits, as well as the noise figures and bandwidths of preamplifiers, limit the usefulness of conventional semiconductor technologies.

Clock recovery circuits are necessary for the correct interpretation of incoming signals. Optical data is often sent in a non-return-to-zero (NRZ) mode. In the NRZ mode, data is sent continuously with no break or transition to a neutral state between bits. Thus, there may be long strings of 1's or 0's where there are no transitions between the two digital states from which the phase of the data clock can be recovered. If the clock is not properly set, the data can not be properly retimed and will thus be interpreted at the receiver incorrectly. Accordingly, there is a need in the art for clock recovery schemes which can recover the phase of the clock and retime optically transmitted data.

Current analog clock recovery schemes for datastreams operating at gigahertz (GHz) frequencies use a combination of mixing and filtering in a feedback loop to adjust the frequency of the clock recovery circuit to the clock frequency of the data. Examples of these types of systems are described in the articles by Razavi, *IEEE J. of Solid-State Circuits*, 3, 472 (1996) and Andersson, et al., *IEEE J. of Solid-State Circuits*, 3, 210 (1995). A drawback of these circuits, however, is that several hundred to a thousand or more clock cycles are typically required to recover the clock frequency. An additional drawback is that they require multichip modules to integrate the analog and digital components.

Another drawback of current semiconductor optical detection circuits is the need for one or more wideband preamplifiers between the optical detector and the semiconductor-based data recovery and analysis circuitry. The typical optical detector is a photodiode which converts the number of photons received at the photodiode per unit time to a current. This resulting current is in the tens of microamperes and so must be amplified to be used as an input for standard semiconductor circuitry. Current commercially available amplifiers limit the bandwidth of the receiver.

The optical detector circuits of the present invention overcome these drawbacks of semiconductor circuitry through the use of superconductors. Superconductor circuitry can be made sensitive to small currents and has been shown to be useful in producing ultrafast logic circuitry. For example, Likharev, et al., *IEEE Trans. Appl. Supercond.*, 1, 3 (1991) discusses superconductor circuitry in these environments, and is herein incorporated by reference. The optical detector and clock recovery circuits of the present invention meet a need for a high speed digital optical receiver with instantaneous or near instantaneous clock recovery and without the use of noise-generating and bandwidth-limiting preamplifiers.

SUMMARY OF THE INVENTION

The present invention relates generally to an optical receiver and clock recovery circuit for use in receiving and recovering the clock of optically transmitted data. One embodiment of the invention is capable of receiving optical data and recovering the clock from that data instantaneously with a locking time of one bit, low jitter, and a wide tracking bandwidth for short data packets.

One embodiment of the invention is an optical signal receiver which includes an optical signal detector for receiving optically-transmitted data and generating an electrical signal in response to the data. The electrical signal is then sent to a single flux quantum (SFQ) transition detector which converts the data into a stream of SFQ pulses. The SFQ pulse stream is directed to a clock recovery circuit which recovers the phase of the data clock for each pulse. This optical signal receiver may be integrated on a single chip.

Another embodiment of the invention is a clock recovery circuit of the type used to recover a clock signal from digital data in the form of a stream of single flux quantum pulses. The oscillator includes an input for receiving the stream of pulses, an output for delivering the recovered clock signal, and an oscillator loop operatively coupled to the input and output. The oscillator loop is made, at least in part, from a Josephson transmission line. The oscillator also includes an oscillator initiator operatively connected to the oscillator to initiate a rotating oscillator signal within the oscillator loop. The oscillator provides a periodic clock signal to the output, after initiation, as the rotating oscillator signal rotates around the loop. The oscillator also recovers the clock signal of the data in response to a pulse from the SFQ pulse stream.

Another embodiment of the invention includes a data retiming circuit with a non-destructive read-out (NDRO) cell and one or more Josephson transmission lines (JTL).

It will be appreciated that the invention is not limited to the embodiments described, but instead should be interpreted in accordance with the broad meaning of the claims attached hereto. A more detailed description of a preferred embodiment is provided in the accompanying detailed description and drawings

BRIEF DESCRIPTION OF THE DRAWINGS

Referring now to the drawings, wherein like reference numerals and letters indicate corresponding structure throughout the several views:

FIG. 2(*b*) is a circuit diagram of a pulse splitter having one input and two outputs;

DETAILED DESCRIPTION

Figure 1:
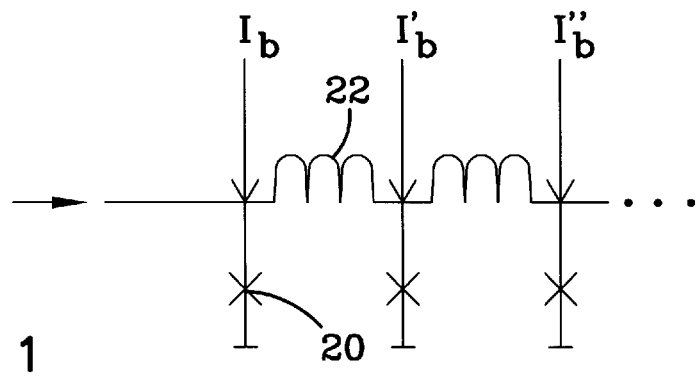
FIG. 1 is a circuit diagram of one embodiment of a Josephson transmission line.

The digital optical receiver and clock recovery circuits constructed in accordance with the principles of the present invention are capable of providing a clock signal from a single bit of an optically transmitted digital signal with a data transmission rate of greater than 40 Gb/s. Accordingly, the present invention provides a faster, more robust circuit than existing clock recovery circuits which use semiconductor components that often require upwards of 1000 bits to recover the phase of the clock. In preferred embodiments of the present invention, the circuits are formed, at least in part, using superconductor materials and their unique properties. Further, these circuits are preferably based on the rapid single-flux-quantum (RSFQ) circuit family which has been developed for superconducting logic circuits.

By way of review, the basic building block for RSFQ circuits is the Josephson junction. Those skilled in the art will appreciate that a Josephson junction is a weak link between two superconducting materials. One preferred Josephson junction for use in the circuits of the present invention is a narrow region of insulating material, such as aluminum oxide, between two regions of superconducting material, such as niobium. Josephson junctions can be made using both Low-$T_c$ and High-$T_c$ superconductors. $T_c$ refers to the critical temperature of a superconducting material below which the material is superconducting. Low-$T_c$ superconductors are often metals, such as niobium, and have critical temperatures below about 20 K. High-$T_c$ superconductors are typically ceramics, such as yttrium barium copper oxide (YBCO), which have critical temperatures that, in some cases, are above 100 K.

Despite the non-superconducting nature of the material that makes up the Josephson junction, if it is narrow enough, superconducting electrons will tunnel across the Josephson junction. The junction remains superconducting as long as the current through the junction is not greater than a critical current, $I_c$, specific to the junction. The critical current of the junction will depend on the material of the junction, as well as the thickness of the junction.

If a current greater than $I_c$ flows through the junction, the junction becomes resistive, with a resistance, $R_n$, and a corresponding potential across the junction. This is often called the voltage or resistive state of the junction. This switch from the superconducting to the voltage state can occur in just a few picoseconds.

The RSFQ technology from which preferred circuits of the present invention are constructed utilizes overdamped Josephson junctions in its logic circuitry. An overdamped Josephson junction has a McCumber-Stewart parameter, $\beta_c$ that is less than or equal to 1. This parameter is calculated from the following equation:

$$\beta_c = \left(\frac{\hbar}{2e}\right) I_c R_{ef}^2 C \tag{1}$$

where h is Plank's constant (approximately $1.055 \times 10^{-34}$ J s), C is the capacitance of the junction and $R_{ef}$ is the effective resistance of the junction:

$$R_{ef}^{-1} = R_n^{-1} + R_s^{-1} \tag{2}$$

where $R_n$ is the resistance of the junction in its resistive state and $R_s$ is the active impedance of the environment as seen by the junction. Often the capacitance of the junction is so large that $\beta_c$ is greater than 1. To lower $\beta_c$ a shunt resistor is connected in parallel with the junction to decrease the effective resistance.

During operation, a bias current, $I_b$, is typically applied to the Josephson junction. If the Josephson junction is overdamped and a bias current, $I_b \leq I_c$, is applied to the junction, Josephson junction dynamics indicates that a current pulse $I_{in}$ (t) of short duration and sufficient amplitude ($I_b+I_{in}>I_c$) will induce a quantized leap in the magnetic phase, $\Phi$, of the junction: $\Delta\Phi=2\pi$. After the current pulse, the junction is self-reset to its original superconducting state.

The operation of the Josephson junction is analogous to an overdamped pendulum. If the pendulum is in a near critical state, a small push will cause the pendulum to make a full (2 π) rotation. Because the pendulum is overdamped it will then return to its near critical state.

This 2 π transition in magnetic phase caused by the short current pulse creates a single flux quantum (SFQ) voltage pulse (or signal) across the junction:

$$\frac{d\Phi}{dt} = \frac{2e}{\hbar}V(t) \qquad (3)$$

The duration of this pulse is close to the characteristic time limit, $\tau_0$, for the transition between the superconducting and resistive states of a junction. The time limit can be calculated from the following formula:

$$\tau_0 = \left(\frac{\hbar}{4e}\right) I_c R_{ef} \qquad (4)$$

where e is the charge of an electron (approximately $1.6021 \times 10^{-19}$ C). Thus, the length of the pulse is dependent on the size and materials of the junction (through both $I_c$ and $R_{ef}$). For niobium/aluminum oxide/niobium (Nb/AlO$_x$/Nb) junctions with $I_c$=100 μA, $\tau_0$ is calculated to be about 5 picoseconds for junctions having a thickness of less than 5 μm, and close to one picosecond for junctions having a thickness of less than about 1–2 μm. In addition to short switching times, the small currents and resistances of these junctions mean that an average energy dissipation for Nb/AlO./Nb Josephson junctions for the transmission of SFQ pulses is on the order of about $10^{-18}$ J per junction. SFQ pulses can be used to provide quick, reproducible, and energy efficient digital circuitry.

An SFQ voltage pulse has a magnetic flux associated with it. This magnetic flux is quantized in units of $\Phi_0$=h/4 πe=$2.07 \times 10^{-15}$ Wb. These units of quantized magnetic flux are called fluxons. Because of the interrelated nature of the SFQ pulse and the fluxon, the SFQ pulse can also be described in terms of a fluxon moving through the Josephson transmission line. The terms "voltage pulse" (or simply "pulse") and "fluxon" can be and are used interchangeably herein.

Also by way of review, Josephson junctions can be used to construct a Josephson transmission line (JTL), an example of which is shown in FIG. 1, for transmitting SFQ signals over a distance. The Josephson transmission line is made by connecting several Josephson junctions 20 in parallel by superconducting strips 22 having a relatively low inductance, L<$\Phi_0$/$I_c$Preferably, L≈0.5 ($\Phi_0$/$I_c$) (a few picohenries for the Nb/AlO$_x$/Nb junctions used in a preferred embodiment of the present invention). The junctions 20 are optionally shunted with resistors, not shown, to ensure that they are overdamped. The junctions are typically biased with a current, $I_b$<$I_c$.

If a 2 π transition in the magnetic flux is produced by a short current pulse at a Josephson junction at either edge of the Josephson transmission line then the pulse will be transmitted along the line to the other end with a delay determined by the length of the connecting inductors (i.e., the time it takes to travel between junctions) and the switching time of the Josephson junctions.

Figure 2A:
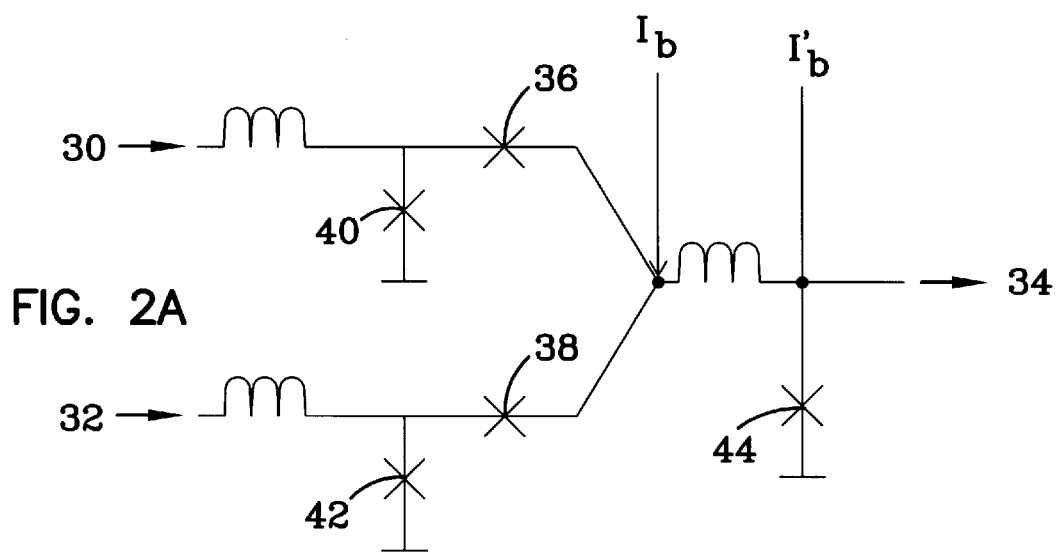
FIG. 2(*a*) is a circuit diagram of a confluence buffer having two inputs and one output.
Figure 2B:
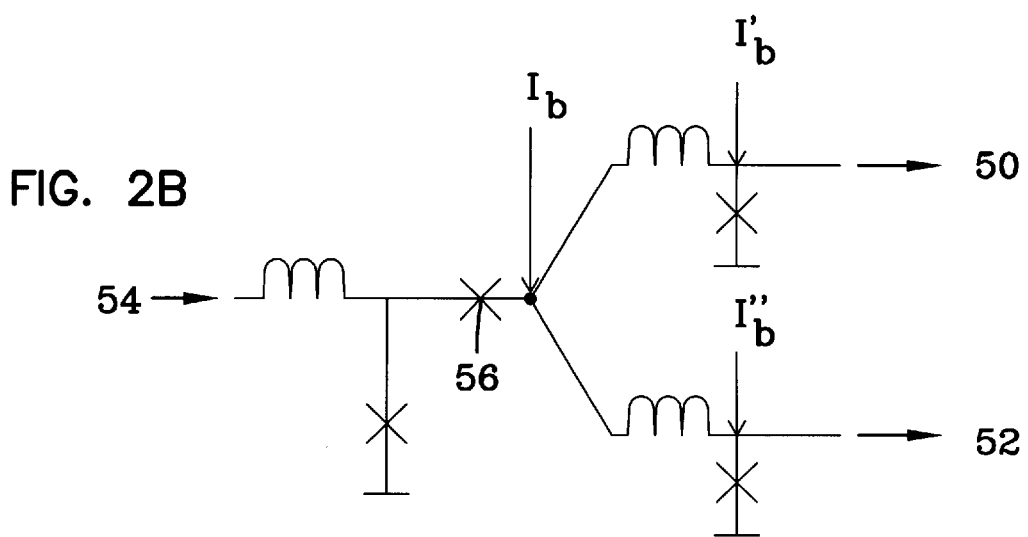

Another common RSFQ circuit element is a confluence buffer, examples of which are shown in FIGS. 2a and 2b and described in more detail in the article by Likharev, et al., discussed hereinabove. The confluence buffer is essentially a circuit element that allows for the combination or splitting of SFQ signals. In FIG. 2a, SFQ signals from either of the two inputs 30, 32 will produce an SFQ signal at output 34. If pulses from both inputs 30, 32 arrive close in time, only one signal will be provided at output 34. Flow-limiting Josephson junctions 36, 38 are provided on the two input lines to prevent signals from output 34 from penetrating into inputs 30, 32. To achieve this function, flow-limiting junctions 36, 38 either have a lower critical current or are biased at higher currents than transmission junctions 40, 42. A signal from input 30 will cause a 2 π transition in the magnetic phase of transmission junction 40, but not in the magnetic phase of flow-limiting junction 36. An SFQ pulse is transmitted to transmission junction 44 and to output 34.

An SFQ pulse arriving from output 34 will draw current across both flow-limiting junction 36 and transmission junction 40, but because flow-limiting junction 36 is biased closer to its critical current, the SFQ pulse will induce a transition in the magnetic phase of flow-limiting junction 36 first and therefore, the pulse will not be transmitted to transmission junction 40 or input 30. Junctions 38, 42 and input 32 operate in a similar manner. This configuration of the confluence buffer prevents output signals from penetrating into the input channels.

A similar confluence buffer, which is also called a pulse splitter, can be made which will divide the signal, as shown in FIG. 2b. In this circuit component, a separate signal is provided at both outputs 50, 52 from input 54. Flow-limiting junction 56 prevents signals from outputs 50,52 from penetrating into input 54. This confluence buffer acts as a pulse splitter, creating SFQ pulses of magnitude approximately equal to the original pulse in both outputs 50, 52.

A confluence buffer may have more than two inputs or outputs. For example, a pulse splitter may split an input SFQ pulse into three or more output SFQ pulses so long as the sum of the critical currents of the initial Josephson junctions of the output lines is not more than 1.5 times the critical current of the final Josephson junction of the input line.

Figure 3:
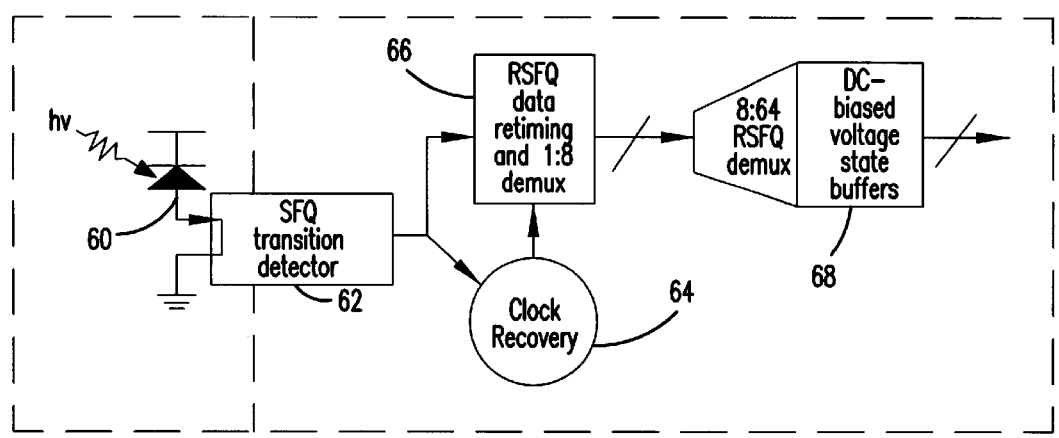
FIG. 3 is a schematic diagram of one embodiment of a digital optical receiver constructed in accordance with the principles of the invention.

Turning now to a description of various, non-limiting embodiments of the present invention, one embodiment is a digital optical receiver which utilizes RSFQ circuitry to provide a fast, efficient receiver which does not need a preamplifier and which is capable of recovering a clock from the digital optically-transmitted data in only a single bit. One embodiment of the digital optical receiver of the present invention is schematically illustrated in FIG. 3. This receiver includes an optical signal detector 60 for receiving an optical signal and converting it to an electrical signal, an SFQ transition detector 62 for converting transitions between digital states in the electrical signal to a stream of SFQ pulses, a clock recovery circuit 64 for recovering the phase of the clock from the SFQ pulse stream, and, optionally, a retiming circuit and a demultiplexor 66 for retiming and demultiplexing the data or a counter for testing the clock recovery circuit. Other demultiplexors 68 or similar output devices may be used to manipulate the data after it has been received and retimed using the recovered clock signal.

The optical signal detector 60 of the digital optical receiver is a circuit or component capable of converting optical signals to electrical signals. Optical signal detector 60 typically includes a photodetector. A preferred photodetector is a photodiode. A particularly useful 40 GHz wideband GaInAs/InP p-i-n photodiode is described in detail, along with its cryogenic performance, in Zhang, et al., *J. of Lightwave Tech.*, 15, (1997), incorporated herein by reference. This photodiode, at cryogenic temperatures, has much lower dark current and a similar modulation bandwidth when compared with other photodiodes. In addition, no carrier trapping is found at temperatures as low as 9 K. Other photodetectors and photodiodes known to those skilled in the art may also be used.

The optical signal detector 60 typically converts the number of photons per unit time into a current. Most photodiodes produce such low currents that one or more preamplifiers must be inserted between the photodiode and a semiconductor transition detector. The addition of the preamplifiers introduces noise, limits bandwidth, and requires more power.

Figure 4:
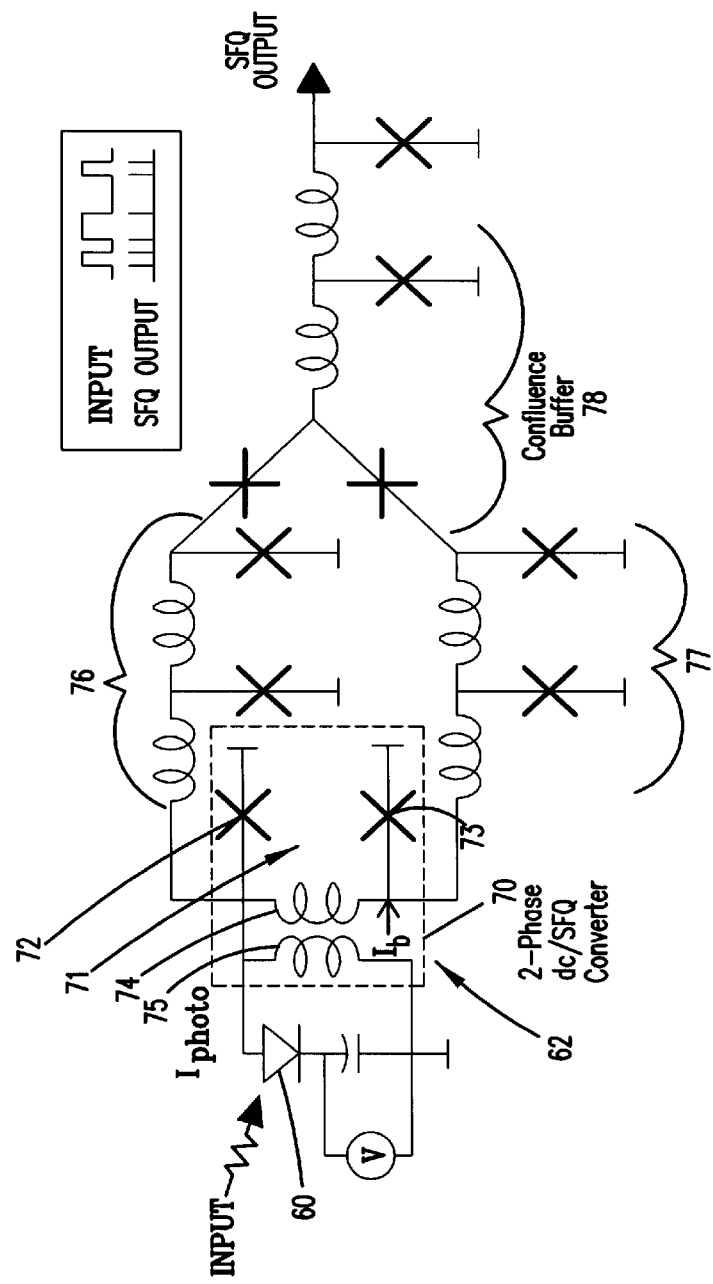
FIG. 4 is a schematic diagram of an SFQ transition detector for use in the digital optical receiver of FIG. 3 to convert a signal from a photodetector into a stream of single flux quantum pulses, an inset shows the conversion by the SFQ transition detector of a sample signal from an optical signal detector to a stream of SFQ pulses.
Figure 5:
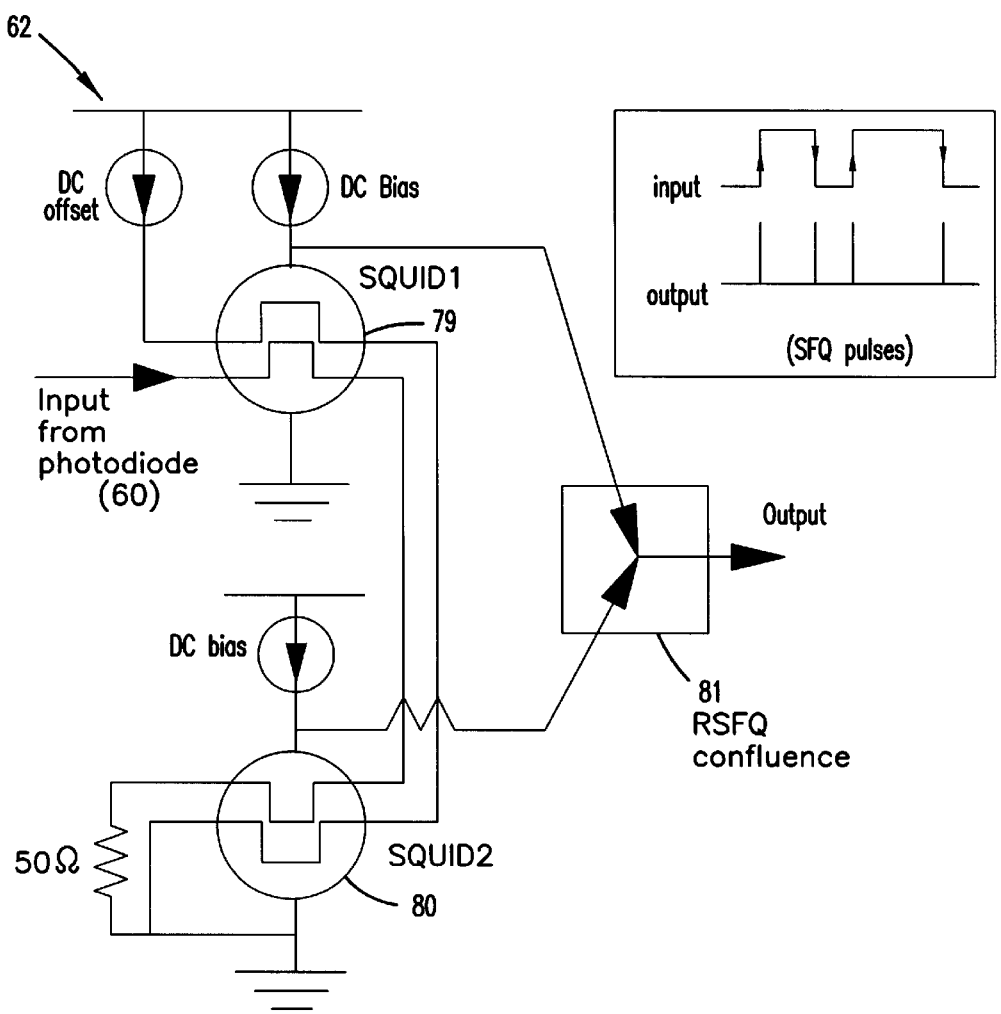
FIG. 5 is a schematic diagram of an alternate SFQ transition detector for use in the digital optical receiver of FIG. 3, an inset shows the conversion of a sample signal to a stream of SFQ pulses by the SFQ transition detector.

The typical SFQ transition detector 62 for use in digital optical receivers of the present invention is sensitive enough to operate with direct unamplified input from the optical signal detector 60. SEQ transition detector 62 converts the NRZ data signal from photodetector 60 into a stream of SEQ pulses, each pulse corresponding to a transition between states in the digital data (e.g., 0→1 or 1→0). To accomplish this function, transition detector 62 typically includes a dc/SEQ converter. Examples of suitable SFQ transition detectors are shown in FIGS. 4 and 5. Examples of other suitable transition detectors and dc/SFQ converters can be found in Likharev, et al.

The transition detector 62 of FIG. 4 includes a two-phase dc/SEQ converter 60 which has an asymmetrically biased dc SQUID (Superconducting Quantum Interference Device) 71 with two Josephson junctions 72, 73. SQUID 71 is coupled to the electrical signal (e.g. photocurrent) from the photodetector 60 by two inductors 74, 75. Attached to SQUID 71 are two JTLs 76, 77. For a positive transition in the data (e.g. , 0→1 transitions in the data), Josephson junction 73, which is positively biased, experiences a 2 n transition to produce an SEQ pulse that travels down JTL 77. A negative transition in the data (e.g., 1→0 transitions in the data) causes a 2 π transition in junction 72 which produces an SEQ pulse that travels down JTL 76. The pulses are combined at confluence buffer 78 to form a single data stream of SFQ pulses, each pulse corresponding to a transition between digital states in the optically-transmitted data, as shown in the inset of FIG. 4.

An alternative transition detector 62, shown in FIG. 5, has two asymmetrical dc SQUIDs 79,80 inductively coupled, in opposite directions, with both the optical signal detector current and a dc offset current to detect the change in current from the optical signal detector 60. When a transition occurs in the data, the current from detector 60 changes which causes a change in the magnetic flux through the SQUID. Because the current flowing through a SQUID is dependent on the magnetic flux of the SQUID, there will also be a change in the current through each of the SQUIDs. This can create an SFQ pulse.

The two SQUIDs 79,80 are coupled in opposite directions of current flow so that one SQUID will detect increases in current (e.g., 0→1 transitions in the data) and the other will detect decreases in current (e.g., 1→0 transitions in the data). When a transition occurs in the data from the optical receiver, one of the SQUIDs 79,80 produces an SFQ pulse which is sent to a confluence buffer 81 as shown in the inset of FIG. 5. The pulses from the two SQUIDs 79,80 are combined in confluence buffer 81 to produce the output stream of SFQ pulses which is delivered to the clock recovery circuit 64.

Asymmetrical SQUIDs are used because they have an asymmetric response to changes in magnetic flux. For example, an asymmetrical SQUID may have a very sharp change in current due to an increase in magnetic flux and only a small change in current due to a decrease in flux. The asymmetrical characteristics of the SQUIDs may produce current gain as well. The dc offset current is coupled into the SQUID so that changes in flux cause a greater change in current.

Figure 6:
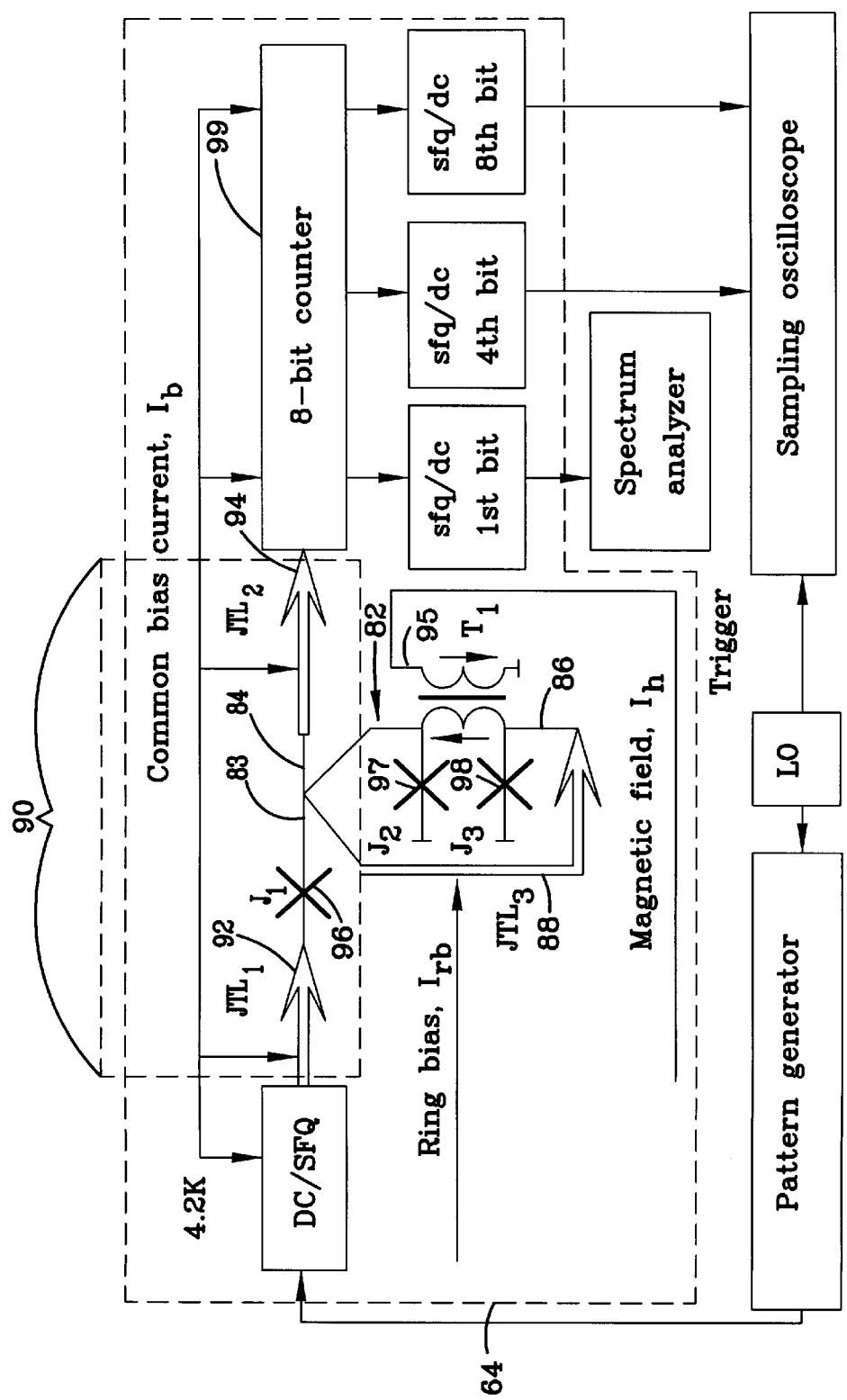
FIG. 6 is a schematic diagram of a first embodiment of a clock recovery circuit in accordance with the principles of the invention for use in the digital optical receiver of FIG. 3, the circuit is connected to an 8-bit SFQ counter and a spectrum analyzer and pattern generator for testing.

Clock recovery circuit 64 is an important component of the digital optical receiver. One embodiment of the clock recovery circuit of the present invention is shown in FIG. 6. The clock recovery circuit 64 generally includes a ring oscillator 82 which has an input 83 for receiving the stream of SFQ pulses from the transition detector 62; an output 84 at which a clock signal is provided to an output device, such as a counter 90, a retiming circuit 130 (see FIG. 11), or a demultiplexor 66 (see FIG. 3); and an oscillator loop 86 that includes a Josephson transmission line 88.

An SFQ pulse in oscillator loop 86 rotates around loop 86 providing a clock signal at output 84. The rotating SFQ pulse is also referred to as the "rotating oscillator signal". The fundamental frequency of the oscillator 82 is determined by the amount of time it takes the rotating SFQ pulse to go around loop 86. This depends on the number of Josephson junctions present in Josephson transmission line 88. The oscillation frequency of the oscillator can be varied by varying the number of junctions in the ring oscillator or the oscillator bias current, $I_{rb}$.

The oscillator is typically coupled to a confluence buffer 90. The confluence buffer has an input Josephson transmission line 92 (hereinafter "input JTL") and an output Josephson transmission line 94 (hereinafter "output JTL") both of which are coupled to ring oscillator 82. A flow-limiting junction 96 is provided between input JTL 92 and both ring oscillator 82 and output JTL 94 to prevent signals from these two components from penetrating into input JTL 92. The critical current of the closest Josephson junction of input JTL 92 to flow-limiting junction 96 is preferably larger than the critical current of flow-limiting junction 96 to create a confluence buffer, as described hereinabove.

Input JTL 92 and output JTL 94 are biased with a common bias current, $I_b$. The Josephson transmission line 88 of oscillator loop 86 is biased with a current, $I_{rb}$. The particular values of these bias currents will depend on the number of junctions in JTLs 88, 92, and 94.

When an SFQ pulse is delivered from the SFQ transition detector 62, it travels through input JTL 92 and enters confluence buffer 90. The SFQ pulse is split by the confluence buffer 90 into three separate pulses. One of these pulses is sent to output JTL 94 and immediately provides the recovered clock for the data stream at the output of the clock recovery circuit. The other two pulses begin rotating in opposite directions around the oscillator loop 86. One of these two pulses intercepts and eliminates the previous rotating oscillator signal. The second SFQ pulse continues rotating around the oscillator loop 86 and replaces the previous rotating oscillator signal.

This new rotating oscillator signal will continue to provide a clock signal to output JTL 94 at the frequency of the oscillator with the phase of the original SFQ pulse until it is eliminated in response to the next SFQ pulse. Thus, each incoming SFQ pulse, corresponding to each transition in the digital data, resets the clock and recovers the phase of the clock. This clock recovery circuit therefore provides a recovered clock signal with a locking time of only a single bit. This is a vast improvement over conventional semiconductor technologies which typically require a string of several hundred to a thousand or more bits to reset the clock to the correct phase.

For oscillator 82 to function properly, an SFQ pulse must be input into the oscillator prior to the start of the data transmission. Typically, this pulse can not be input via input JTL 92 because that would simply start two pulses going around the oscillator in opposite directions a which would eliminate each other. Therefore, an oscillator initiator is coupled to oscillator 82. In the embodiment of the invention shown in FIG. 6, the oscillator initiator is an inductor 95 coupled to an inductor of Josephson transmission line 88 between any two Josephson junctions 97,98 to create a superconducting transformer. Junctions 97,98 form an interferometer similar to a dc SQUID which only allows flux in the interferometer having a quantized value of $\Phi_0$.

Figure 7:
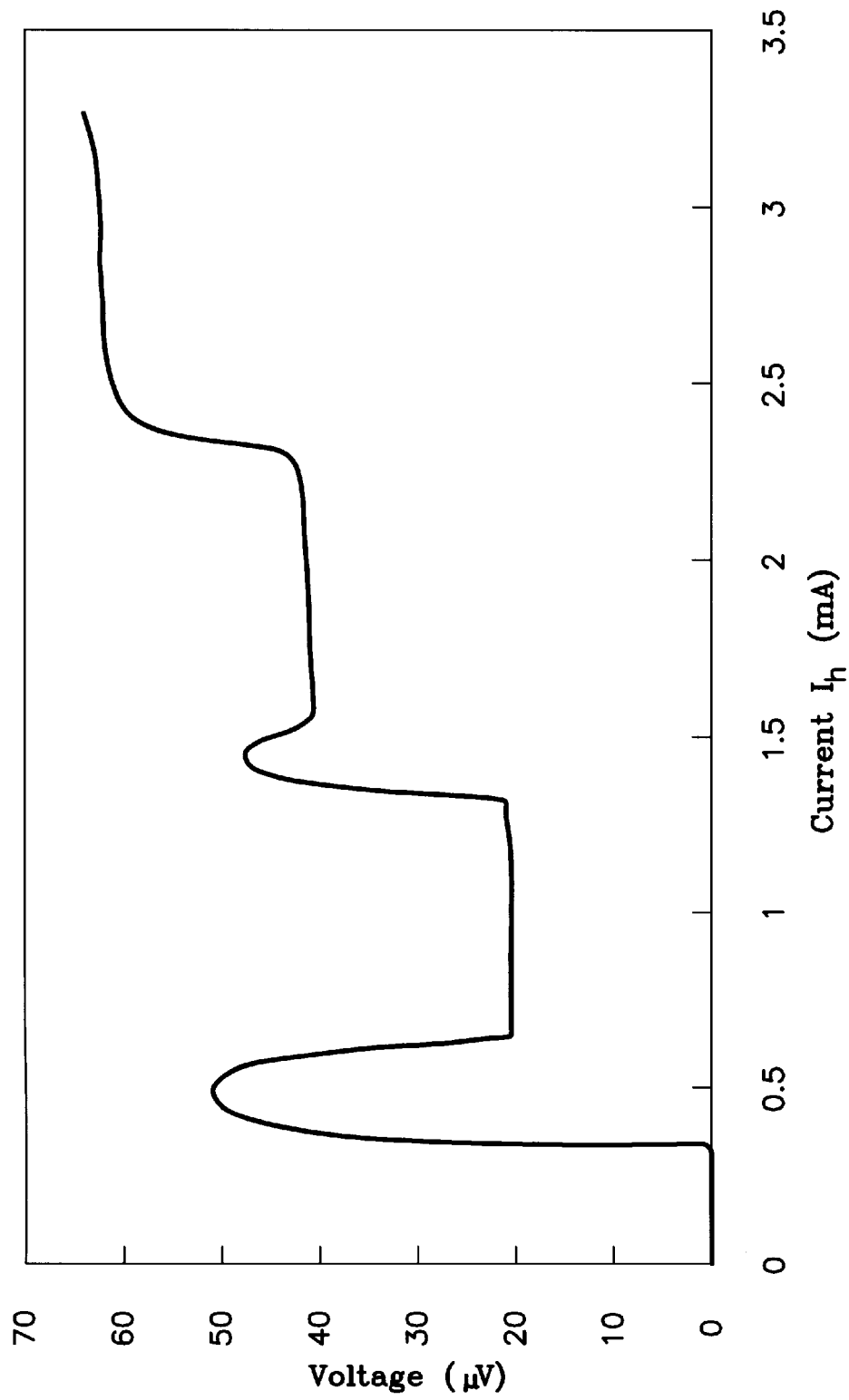
FIG. 7 is a graphical representation of the response of the clock recovery circuit of FIG. 6 to current, $I_h$, from an oscillator initiator.

To initiate a pulse in oscillator loop 86, a current, $I_h$, is provided through inductor 95. The voltage in the circuit developed by this current is graphed in FIG. 7. At low current there is no voltage. If the current is too small to produce one flux quantum in the interferometer of the ring oscillator, it is applied to flow-limiting junction 96. When the applied current increases so that $I_h+I_b>I_c$ of flow-limiting junction 96, then junction 96 switches to the resistive state giving a bump on the I vs. V curve of FIG. 7. When the current, $I_h$, reaches the amount needed to introduce a pulse into loop 86, the current through flow-limiting junction 96 reduces and an SFQ pulse begins rotating around ring oscillator 82. Further increase in $I_h$ can produce two or even three pulses in the oscillator loop 86. This initiates ring oscillator 82 so that it is prepared to recover the phase of the clock from an incoming digital data stream.

Typically, the oscillation frequency of the ring oscillator, $f_{ro}$, is set so that it will be less than the clock frequency of the data, $f_{cl}$, to ensure that the rotating oscillator signal will be eliminated when an SFQ pulse arrives at input 83 of ring oscillator 82. For NRZ data, a "silence parameter", N, can be defined where N is the maximum number of successive identical bits (i.e., all ones or all zeros) in the incoming digital signal. In the typical digital optical receiver of the present invention, an SFQ pulse will only be generated when there is a transition between states (e.g., 1→0 or 0→1) in the incoming signal. So N also indicates the maximum number of data cycles between SFQ pulses.

For the digital data to be correctly retimed, the mismatch between the clock signal from the ring oscillator and the actual clock signal should be less than $t_{ro}=1/f_{ro}$ for any given period of time. This means that for the oscillator to provide an accurate clock, preferably $$N(t_{ro}-t_{cl})<t_{ro} \qquad (5)$$

or, alternatively that:

$$\frac{\Delta f}{f_{cl}} < \frac{1}{N} \qquad (6)$$

where $\Delta f=f_{cl}-f_{ro}$ This latter relation indicates that, for example, the maximum bandwidth of the RSFQ clock recovery signal having a frequency of 20 GHz is preferably 1 GHz if N=20.

This maximum bandwidth corresponds to both the capture range (i.e., initial lock bandwidth) and the tracking range. The capture range is the maximum difference in frequency between the data clock and ring oscillator for which the clock recovery circuit can initally establish a lock on the data clock signal. The tracking range is the maximum difference in frequency between the data and ring oscillator for which the clock recovery circuit can maintain a lock on the data clock signal. Both the capture range and tracking range are the same for the clock recovery circuits described above and both ranges are a function of N, the maximum number of successive identical bits.

Another useful parameter for determining the quality of the circuit is the amount of jitter, $\Delta t_{ro}$. The jitter is estimated to be $\Delta t_{ro}=t_{ro}/Q_0$, where $Q_0$ is the quality of the ring oscillator. Each stage of a counter 99 contains an SFQ to dc converter which produces noise in a frequency range much higher than the frequency of the recovered clock signal. In the presence of such noise, $Q_0$ can be conservatively estimated from the linewidth of the clock signal generated by the oscillator as seen from a counter 99:

$$Q_0=Q_n/2^n \qquad (7)$$

where $Q_n$ is the quality of the nth-output of the counter. In one circuit built according to the principles of the invention and described in the Working Example hereinbelow the measured $Q_0$ for a clock recovery frequency of 10 GHz was about 2000. This circuit, therefore, had a jitter of about 50 femtoseconds.

The jitter in a circuit will introduce a conservatively estimated time error of $N\Delta t_{ro}$. This is preferably less than one clock period $t_{ro}$ or, alternatively, $$\frac{t_{ro}}{\Delta t_{ro}} = Q_0 > 2N \qquad (8)$$

For a $Q_0$ of 2000 and if the frequencies of the data clock and the ring oscillator are identical, then the circuit will operate properly for $N<10^3$.

Figure 8:
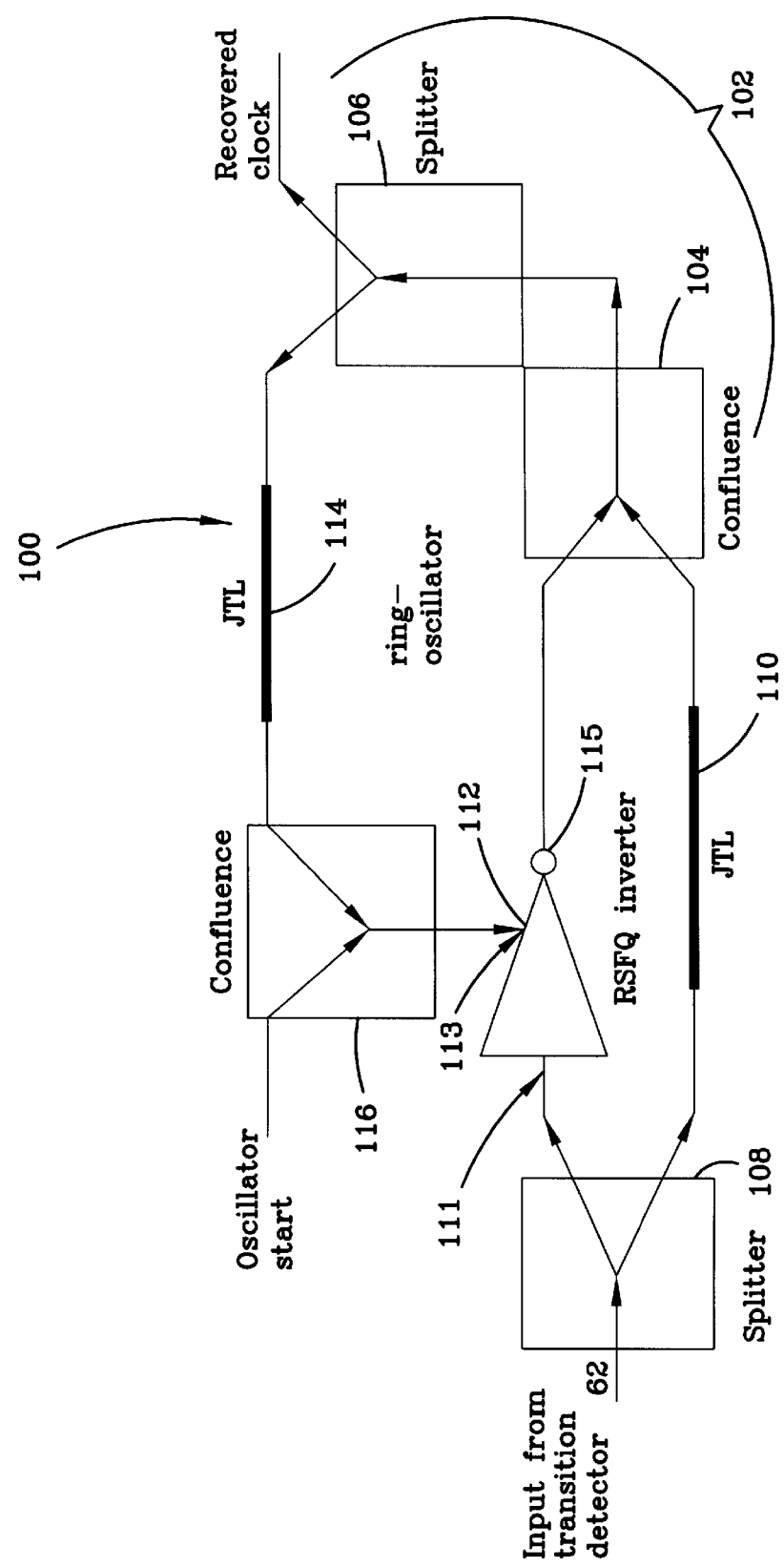
FIG. 8 is a schematic diagram of a second embodiment of a clock recovery circuit constructed in accordance with the principles of the invention.

FIG. 8 illustrates an alternate embodiment of the clock recovery circuit of the present invention. This circuit also includes a ring oscillator 100 coupled to a confluence buffer 102 (made from a confluence buffer 104 and a pulse splitter 106). In this configuration, an SFQ pulse from the transition detector 62 is split into two SFQ pulses by a pulse splitter 108. One SFQ pulse travels through a Josephson Transmission line 110 and enters ring oscillator 100. The second SFQ pulse is input into an RSFQ inverter 112. Examples of suitable RSFQ inverters for this invention are shown in Likharev, et al.

RSFQ inverter 112 has a signal input 111 and a timing input 113. An output SFQ pulse is provided at output 115 based on the state of the circuit when a timing pulse arrives at timing input 113. If an SFQ pulse has arrived at signal input 111 between the previous and present timing pulse then no pulse is sent through output 115 (i.e., 1→0). If there was no pulse at signal input 111 between the two timing pulses than an SFQ pulse is sent out the output 115 (i.e., 0→1). The inverter is reset after each timing pulse.

The inverter 112 operates in the ring oscillator 100 in the following manner. The timing pulse for the inverter 112 is a rotating oscillator signal traveling around ring oscillator 100. During each oscillation cycle, the oscillator signal interrogates inverter 112 to determine if any pulse has arrived from transition detector 62. If there has been no pulse from transition detector 62 than a rotating oscillator signal is output with the same phase as the previous signal. If, however, there has been a pulse from transition detector 62 then no output signal is sent from the inverter 112 and the rotating oscillator signal is eliminated. The first SFQ pulse from the pulse splitter 108 that travels through Josephson transmission line 110 replaces the rotating oscillator signal.

The frequency the ring oscillator 100 of this embodiment of clock recovery circuit 62 is determined by the amount of time that it takes for the pulse to travel around the loop. This frequency can be adjusted, for example, by altering the components of the ring and in particular the number of Josephson junctions in Josephson transmission line 114.

In this embodiment of the invention, a different type of oscillator initiator is depicted. The oscillator initiator is a source of current pulses, not shown, that is coupled to ring oscillator 100 through a confluence buffer 116. An SFQ pulse is created in the oscillator initiator and sent through confluence buffer 116 into ring oscillator 100. Again, flow-limiting Josephson junctions, not shown, are provided to prevent pulses from penetrating into the two input channels of buffer 116.

Once the phase of the clock signal is recovered by clock recovery circuit 64, it can be sent to output devices such as a counter 99 (see FIG. 6), retiming circuit 130 (see FIG. 11), or a demultiplexor 66 (see FIG. 3). Counter 99 is often made from RSFQ flip flops such as those found in Likharev, et al. An 8-bit counter can be made from eight T-flip flop circuits connected in series. The output from each of the T-flip flop circuits can also be used as a clock signal having a frequency that is $\frac{1}{2^n}$ of the original clock signal, where n is the number of flip flop circuits that the clock signal passes through (i.e., the output of the third flip flop circuit of the 8-bit counter would have a frequency one-eighth that of the original clock frequency from the clock recovery circuit).

Figure 9:
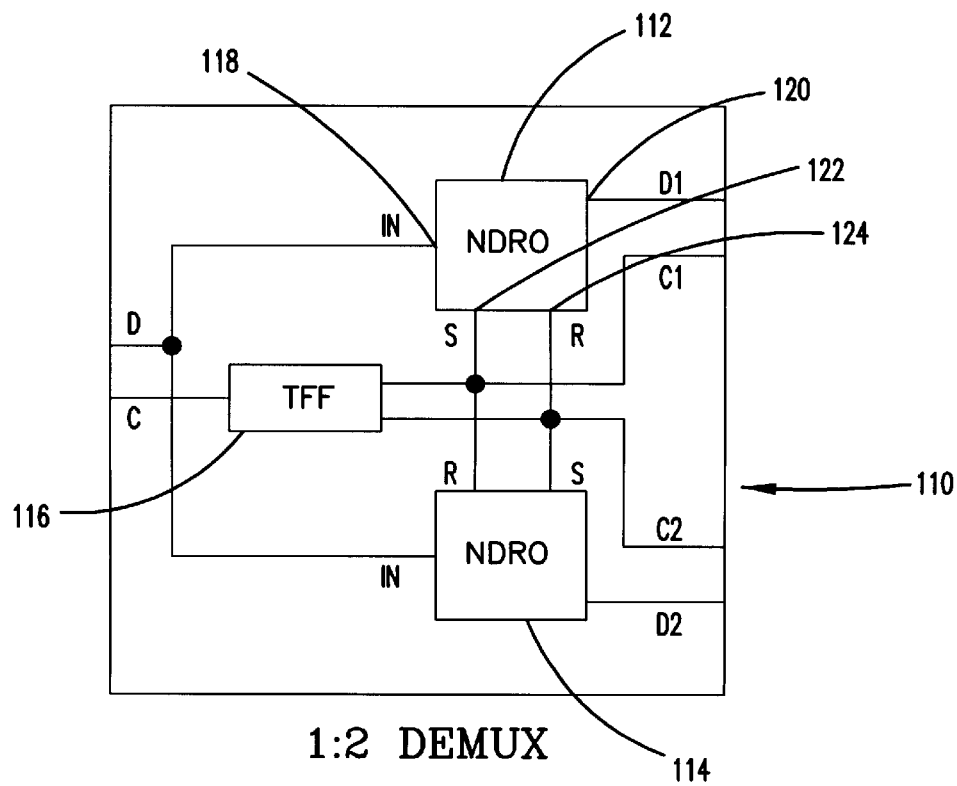
FIG. 9 is a schematic diagram of a 1:2 demultiplexor for use in demultiplexing the optically-transmitted data received by the digital optical receiver of FIG. 3 utilizing the clock signal recovered by the clock recovery circuit of FIG. 6.

The counter 99 can be used in conjunction with a demultiplexor 66 to demultiplex the digital data. Additional demultiplexors 68 can also be added to further demultiplex the digital data. Preferably, the first demultiplexor 66 is an RSFQ demultiplexor. One example of demultiplexor is an RSFQ self timed 1:2 demultiplexor 110 (DEMUX or DMUX) shown in FIG. 9. Demultiplexor 110 includes two NDRO (non-destructive read-out) cells 112, 114 and a T-flip flop cell 116. An NDRO cell acts as a gated switch with an input port 118, an output port 120, a SET input 122, and a RESET input 124. An SFQ pulse at the SET input 122 will set the NDRO cell to an open state. In this open state, an SFQ pulse at input port 118 will be asynchronously transmitted to output port 120. An SFQ pulse at the RESET input 124 will set the NDRO cell to a closed state. An SFQ pulse at the input port 118 will not be transmitted to the output port 120 as long as the NDRO cell is in the closed state.

Figure 10:
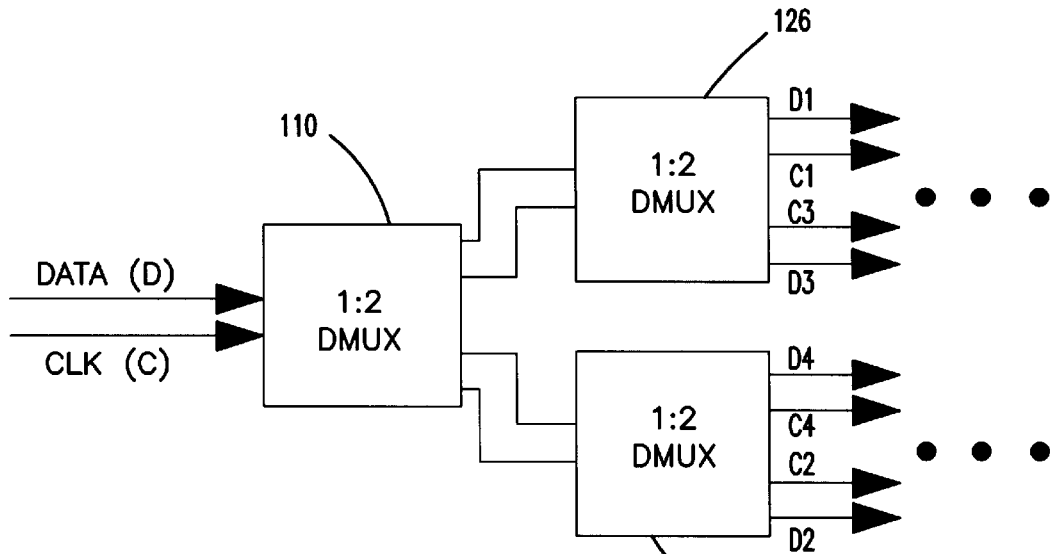
FIG. 10 is a schematic diagram of multiple demultiplexors of the type shown in FIG. 9 to further demultiplex signals from the digital optical receiver of FIG. 3.

Demultiplexor 110 operates by providing the data signal from the optical detector 60 or a retiming circuit, described below, to the two NDRO cells 112, 114 at the input port 118 of each cell. In addition, the clock signal from clock recovery circuit 64 or counter 99 is sent to T-flip flop 116. The T-flip flop 116 alternates with each clock signal between sending an SFQ pulse to 1)the SET input of NDRO 112 and the RESET input of NDRO 114 and 2)the RESET input of NDRO 112 and the SET input of NDRO 114. Thus, the two NDRO cells 112, 114 alternate being open and closed so that the data is split into two signals. Additional demultiplexors 126, 128 can be provided at the outputs of the first demultiplexor 110 to further demultiplex the data stream, as shown in FIG. 10. Examples of NDRO cells suitable for use in demultiplexors 110, 126, and 128 can be found in Likharev, et al.

Figure 11:
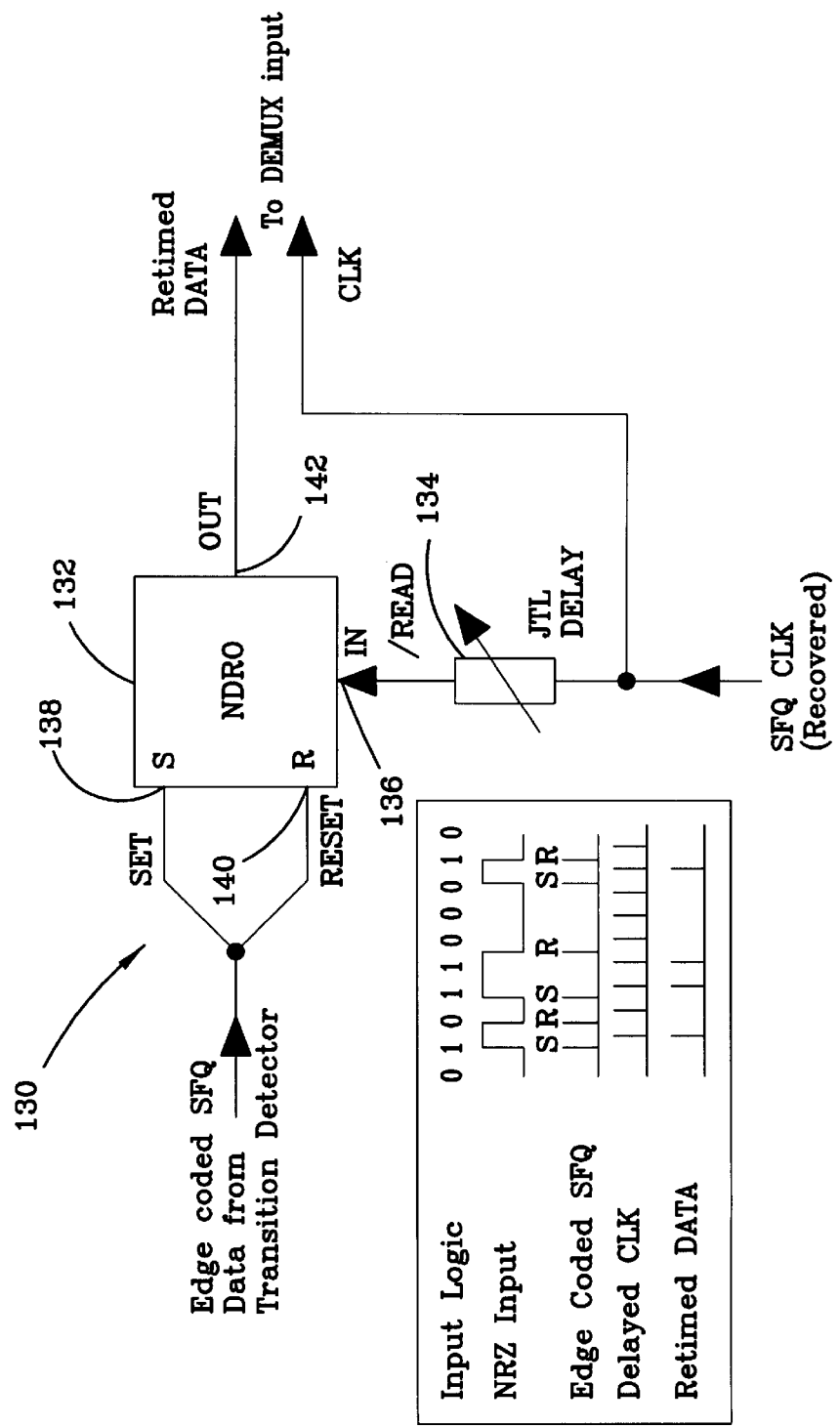
FIG. 11 is a schematic diagram of a retiming circuit for use in retiming data received by the digital optical receiver of FIG. 3 utilizing the clock signal recovered by the clock recovery circuit of FIG. 6.

A retiming circuit can also be connected to the digital optical receiver. FIG. 11 shows one example of a suitable data retiming circuit 130 which includes an NDRO cell 132 and a JTL delay line 134. Delay line 134 is connected to clock recovery circuit 64 and provides a clock signal to the input port 136 of NDRO 132. The clock signal is delayed, preferably by about half a clock cycle, to allow for switching of SET input 138 and RESET input 140 of NDRO 132. Inputs 138, 140 are connected to the output of the transition detector 62. SFQ pulses from transition detector 62 alternately set and reset NDRO 132.

In this manner, the SFQ pulses from the transition detector, which provides pulses for each transition between data states, are converted to a stream of SFQ pulses which mirror the state of the original data. (See inset of FIG. 11.) As an illustrative, non-limiting example, when there is a transition from the 0 to 1 state in the optically-transmitted data, the transition detector 62 provides an SFQ pulse. This SFQ pulse will set NDRO 132 (provided NDRO 132 was in the RESET mode) and an SFQ pulse will be provided at the output port 142 of NDRO 132 for each clock signal arriving at input port 136. This continues until there is a transition from the 1 to 0 state in the data, which causes transition detector 62 to send another SFQ pulse. This pulse will reset NDRO 132 and no SFQ pulses will be provided at output port 142 until there is another transition in the data that is detected by transition detector 62. Thus, the stream of SFQ pulses from output port 142 now corresponds to the 1 states of the original data, as shown in the inset of FIG. 11.

Additional demultiplexors and other circuitry can be added to provide other desired functions. These circuit components can be either RSFQ or semiconductor circuitry. Typically, an SFQ/dc converter will be placed between the superconducting circuitry and the semiconductor circuitry to convert the stream of single flux quantum pulses back into a digital signal. SFQ/dc converters are further described in Likharev, et al.

WORKING EXAMPLE

The invention will be further described in connection with the following working example. This example is not meant to limit the scope of the invention. Variations within the concepts of the invention will be apparent to those skilled in the art.

The clock recovery circuit shown in FIG. 6 was constructed using Nb/AlO$_x$/Nb Josephson junctions on a chip. The chip was fabricated using standard 1 kA/cm$^2$ HYPRES technology. The protocol for this type of junction construction is generally known to those of skill in the art. Further information may also be found in Yu, et al., *IEEE Trans. on Magnetics*, 2, 1476 (1987) and "HYPRES Design Rules—Niobium", HYPRES, Inc. (Elmsford, N.Y.) (also available at http://www.hypres.com), which are incorporated herein by reference. The thickness of the niobium base junction electrode is about 2000 angstroms and the thickness of the niobium counter electrode is about 3000 angstroms. The junction capacitance is bout 38 fF/$\mu$m$^2$.

Figure 12:
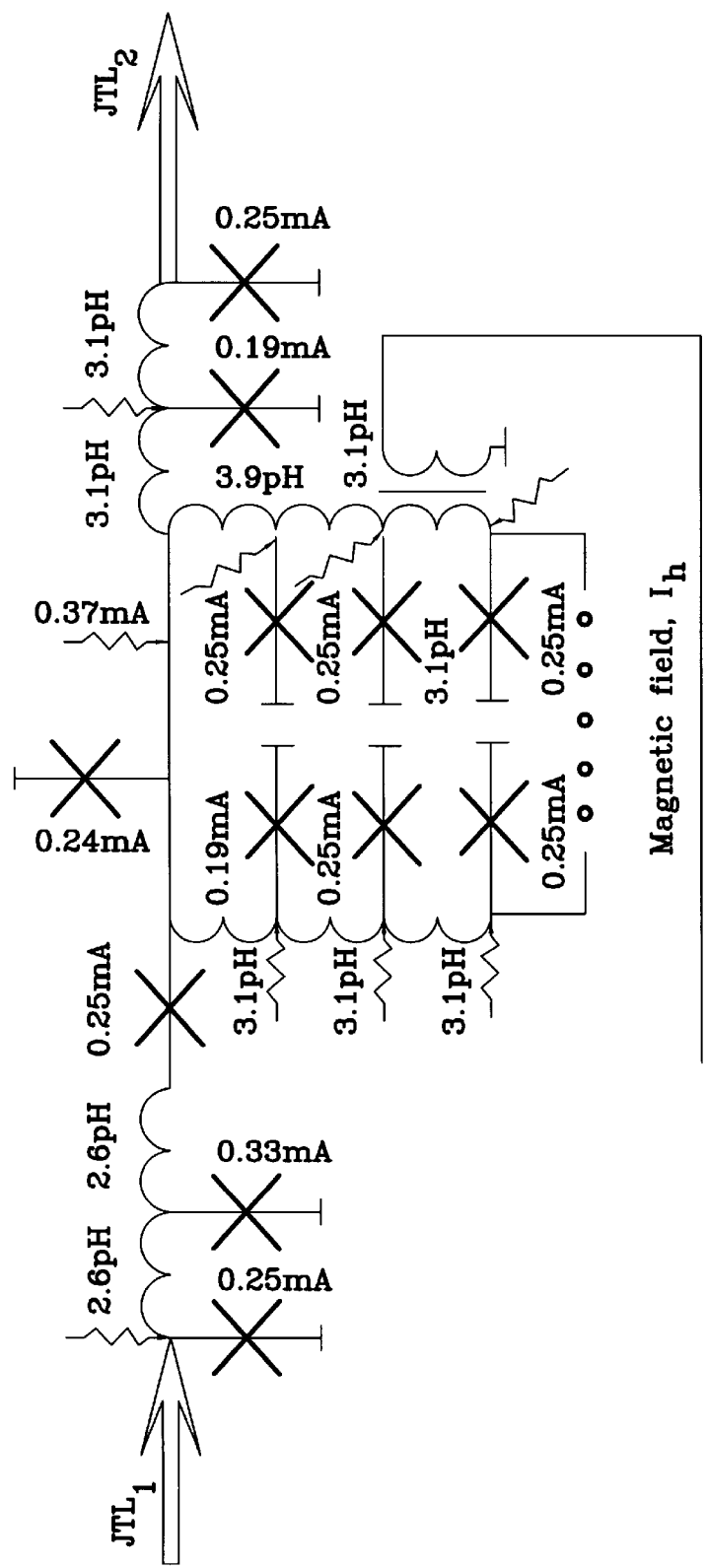
FIG. 12 is a partial circuit diagram of the clock recovery circuit of FIG. 6, critical currents for each Josephson junction are indicated next to the junction, inductance of each inductor is also indicated, each junction is biased at 0.8 of the corresponding critical current unless otherwise indicated at the shunt resistor, resistances are chosen so the $\beta_c=1$ for each junction.

FIG. 12 shows the parameters used for the construction of this clock recovery circuit. The critical current, I$_c$, of each Josephson junction is provided next to the junction and the inductance of each inductor is also provided. The shunt resistors were chosen so that $\beta_c$=1 for each junction. The bias current of the junction was 0.8 of the corresponding critical current unless specified at the shunt resistor of the particular junction.

Critical currents for the junctions ranged from 0.19–0.33 mA. The inductors between the junctions ranged from 3.1–3.9 pH. JTL$_1$ contained 7 junctions, JTL$_2$ contained 10 junctions, and JTL$_3$ contained 83 junctions. A current of about 0.6 mA was required to induce a pulse in the ring oscillator.

Figure 13A:
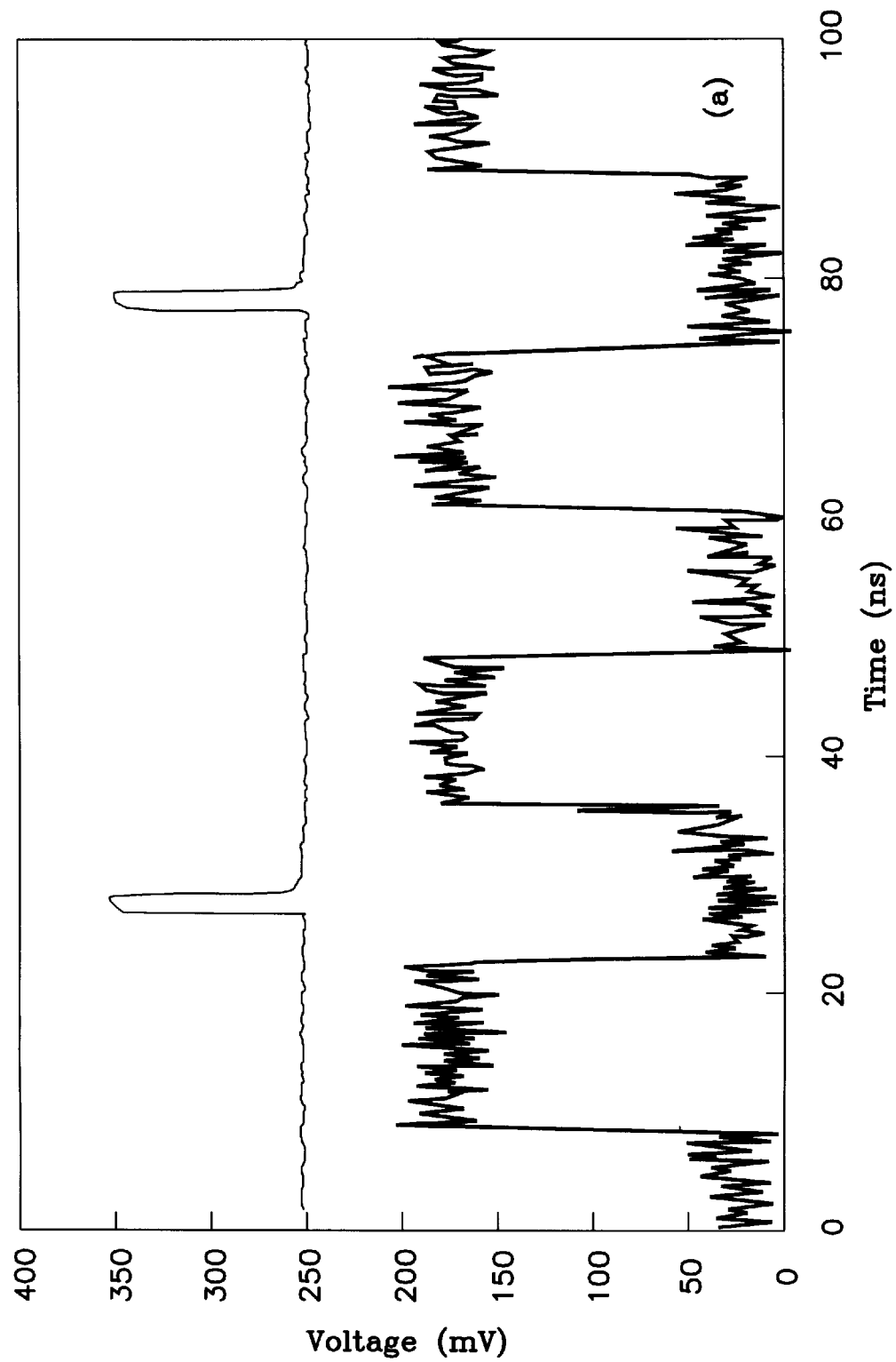
FIG. 13a is a graphical representation of the signals formed by a signal generator (top) and the recovered clock signal from the circuit of FIG. 6 taken from the 8th bit of the counter (bottom, amplified by 1000) where N=512 (i.e., 512 identical bits between transitions), transmission rate=10 Gb/s, $I_h$=5.8 mA, $I_{rb}$=13.66 mA, and $I_b$=14.5 mA.
Figure 13B:
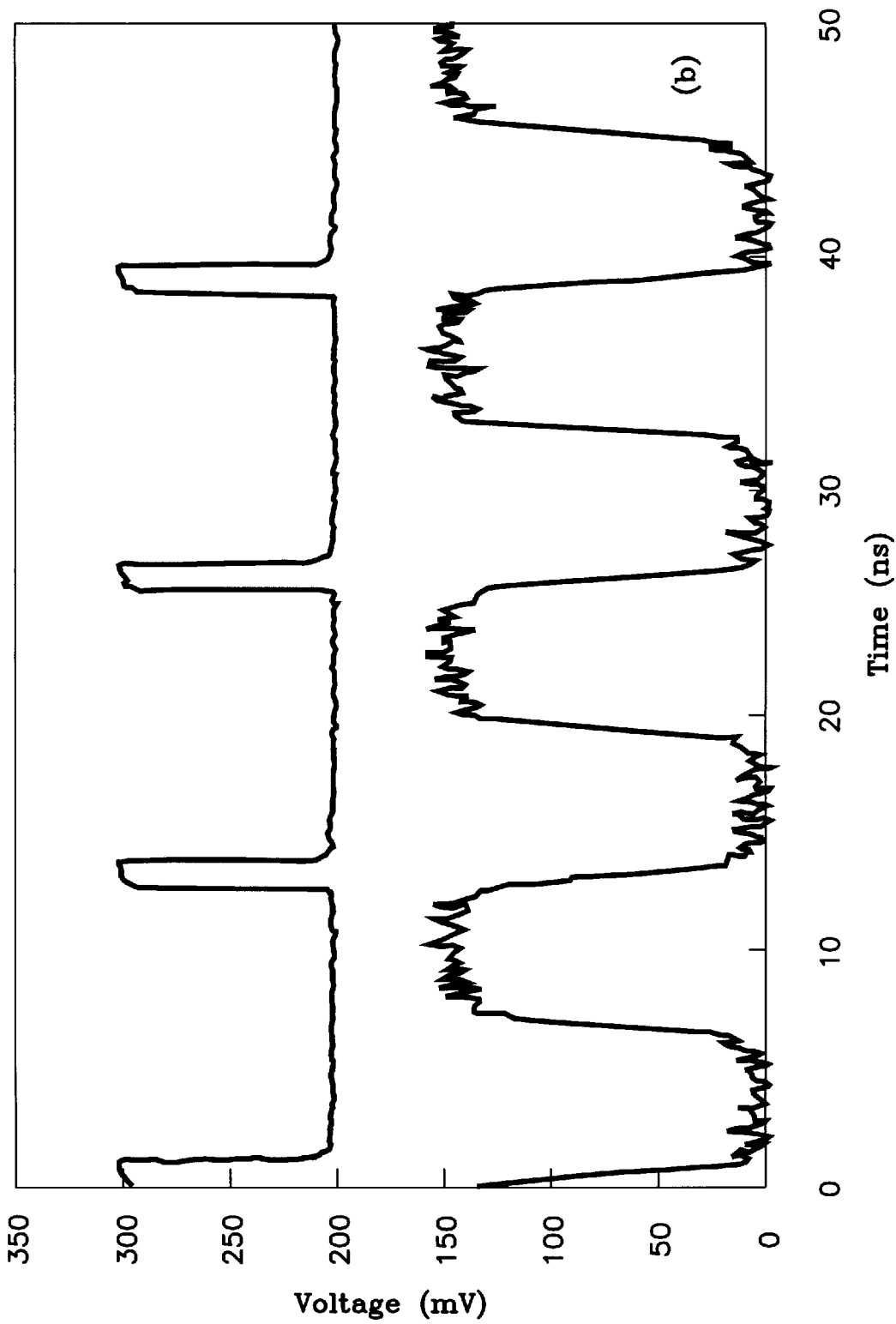
FIG. 13b is a graphical representation of the signals formed by a signal generator (top) and the recovered clock signal from the circuit of FIG. 6 taken from the 8th bit of the counter (bottom, amplified by 1000) where N=256, transmission rate=20 Gb/s, $I_h$=9.5 mA, $I_{rb}$=13.66 mA, and $I_b$=14.5 mA.
Figure 13C:
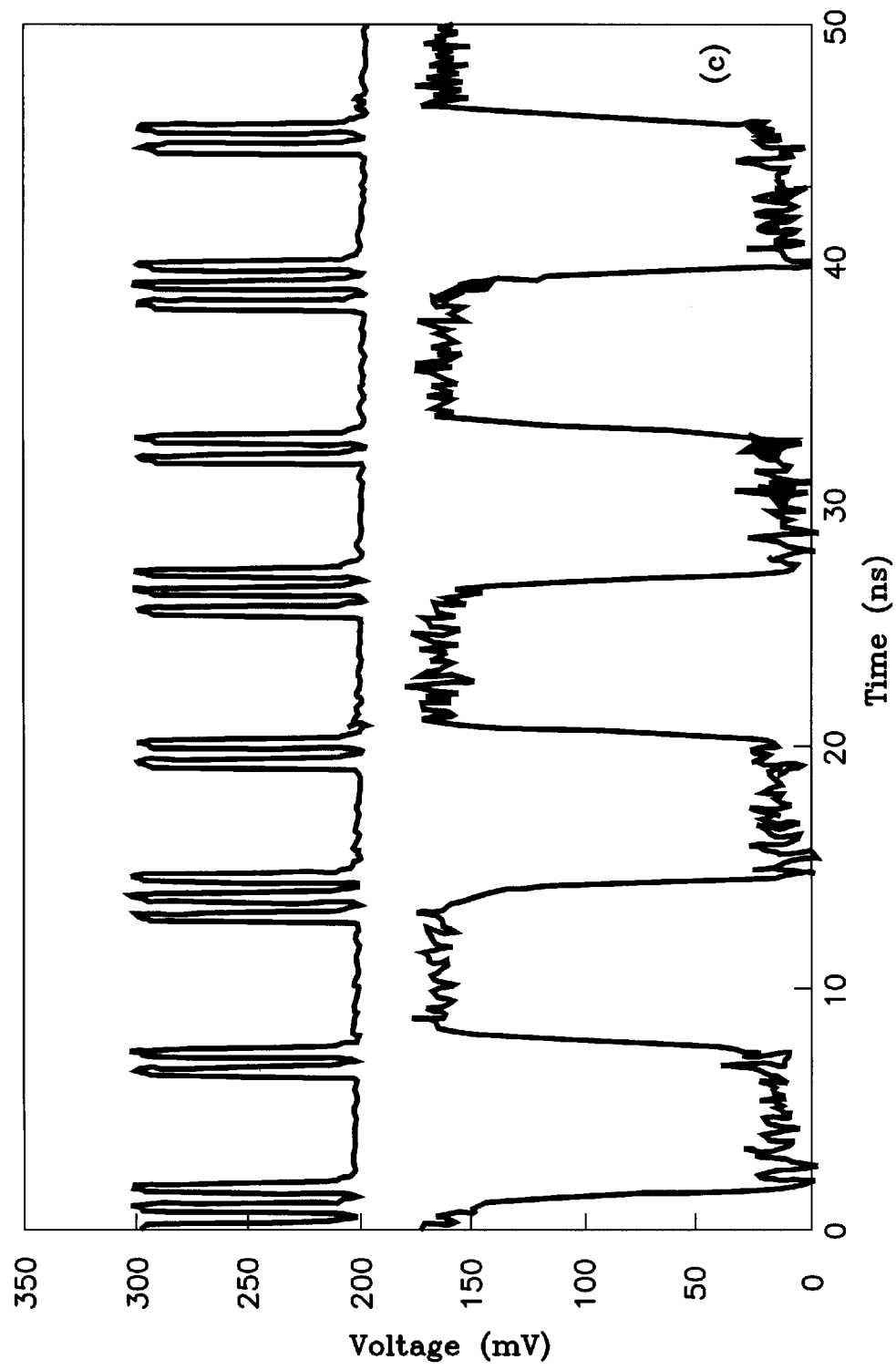
FIG. 13c is a graphical representation of the signals formed by a signal generator (top) and the recovered clock signal from the circuit of FIG. 6 taken from the 8th bit of the counter (bottom, amplified by 1000) at 20 GHz, $I_h$=5.8 mA, $I_{rb}$=13.66 mA, and $I_b$=14.5 mA.

FIGS. 13a–c illustrate test signals formed by a signal generator (top) and at the 8th bit of counter 99 (bottom, amplified by 1000) for various signal configurations. FIG. 13a shows the clock signal from the 8th bit of the counter where N=512 (i.e., 512 identical bits between transitions), transmission rate=10 Gb/s, I$_h$= 5.8 mA, I$_{rb}$=13.66 mA, and I$_b$=14.5 mA. FIG. 13b shows the clock signal from the 8th bit of the counter where N=256, transmission rate=20 Gb/s, $I_h$=9.5 mA, $I_{rb}$=13.66 mA, and $I_b$=14.5 mA. FIG. 13c shows an input signal configuration at 20 GHz, $I_h$=5.8 mA, $I_{rb}$=13.66 mA, and $I_b$=14.5 mA. This data shows that the clock recovery circuit is capable of providing a stable clock for data transmission rates in excess of 1 Gb/s.

The invention has been described with reference to various specific and preferred embodiments and techniques. However, it will be apparent to one of ordinarily skill in the art that many variations and modifications may be made while remaining within the spirit and scope of the invention.

We claim:

1. A clock recovery circuit of the type used to recover a phase of a clock signal from digital data in the form of a stream of single flux quantum pulses, comprising:
   (a) a superconducting oscillator, including an input for receiving the stream of single flux quantum pulses, an output at which a recovered clock signal is provided, and an oscillator loop operatively connected between said input and said output, said oscillator loop comprising a first Josephson transmission line;
   (b) initiating means operatively connected to said oscillator loop for initiating a rotating oscillator signal within said oscillator loop;
   (c) wherein said oscillator loop is arranged and configured to provide, after initiation of said oscillator loop by said oscillating means, a periodic recovered clock signal at said output as the rotating oscillator signal rotates around said oscillator loop; and
   (d) wherein said oscillator is arranged and configured so that the phase of the recovered clock signal is recovered in response to a pulse from the stream of single flux quantum pulses received at said input of said oscillator.

2. The clock recovery circuit of claim 1, wherein when a pulse from the stream of single flux quantum pulses arrives at said input of said oscillator, a first and a second single flux quantum pulse are generated, the first single flux quantum pulse eliminates the rotating oscillator signal and the second single flux quantum pulse replaces the rotating oscillator signal, thereby recovering the phase of the clock signal.

3. The clock recovery circuit of claim 2, wherein the first and second single flux quantum signals rotate around said oscillator loop in opposite directions starting from a same point on said loop.

4. The clock recovery circuit of claim 2, wherein said oscillator loop further comprises an inverter operatively coupled to said input of said oscillator.

5. The clock recovery circuit of claim 4, wherein the first single flux quantum pulse is input in said inverter and eliminates the rotating oscillator signal, and the second single flux quantum pulse enters said loop and replaces the rotating oscillator signal.

6. The clock recovery circuit of claim 1, wherein the clock recovery circuit further comprises a Josephson junction coupled in series with said input of said oscillator.

7. The clock recovery circuit of claim 1, wherein the clock recovery circuit further comprises a second Josephson transmission line coupled to said input of said oscillator.

8. The clock recovery circuit of claim 1, wherein the clock recovery circuit further comprises an SFQ transition detector coupled to said input of said oscillator for converting the digital data to a stream of single flux quantum signals.

9. The clock recovery circuit of claim 1, wherein the clock recovery circuit further comprises a third Josephson transmission line coupled to said output of said oscillator.

10. The clock recovery circuit of claim 1, wherein the clock recovery circuit further comprises a counter coupled to said output of said oscillator.

11. The clock recovery circuit of claim 1, wherein the clock recovery circuit further comprises a demultiplexor coupled to said output of said oscillator.

12. The clock recovery circuit of claim 1, wherein the clock recovery circuit has a locking time of one bit.

13. The clock recovery circuit of claim 1, wherein the initiation means comprises an inductor.

14. The clock recovery circuit of claim 1, wherein the initiation means is inductively coupled to the oscillator.

15. The clock recovery circuit of claim 1, wherein said input and said output of said oscillator are directly connected.

16. The clock recovery circuit of claim 1, wherein said clock recovery circuit has a capture range and a tracking range, both the capture range and the tracking range having substantially identical values which depend on the number of consecutive identical bits in the digital data.

17. A clock recovery circuit of the type used to recover a phase of a clock signal from digital data in the form of a stream of single flux quantum pulses, comprising:
   (a) a confluence buffer comprising a first Josephson transmission line for receiving the stream of single flux quantum pulses, a second Josephson transmission line for delivering a clock signal, and a flow-limiting Josephson junction coupled in series between the first and second Josephson transmission lines as a buffer for the first Josephson transmission line;
   (b) a superconducting oscillator operatively coupled to the confluence buffer between the flow-limiting Josephson junction and the second Josephson transmission line, comprising an oscillator loop, said loop comprising a third Josephson transmission line;
   (c) initiating means operatively connected to said loop for initiating a rotating oscillator signal within said loop;
   (d) wherein said oscillator is arranged and configured to provide, after initiation of said loop by said oscillating means, a periodic clock signal to said second Josephson transmission line as the oscillator signal rotates around said oscillator loop; and
   (e) wherein said oscillator is arranged and configured so that the phase of the clock is recovered in response to a pulse from the stream of single flux quantum pulses received by said oscillator from said first Josephson transmission line.

18. A circuit for receiving digital optical signals and recovering a phase of a clock signal therefrom, comprising:
   an optical signal detector, configured and arranged to generate an electrical signal in response to a digital optical signal;
   an SFQ transition detector operatively coupled to the optical signal detector for generating a stream of single flux quantum pulses in response to the electrical signal from said detector; and
   a clock recovery circuit operatively coupled to the converter, comprising a superconducting oscillator and initiating means operatively connected to said oscillator for initiating a rotating oscillator signal within said oscillator; said oscillator comprising an oscillator loop, said loop comprising a first Josephson transmission line; wherein said oscillator is arranged and configured to provide, after initiation of said oscillator by said oscillating means, a periodic clock signal and to recover the phase of the clock signal in response to a pulse from the stream of single flux quantum pulses received by said oscillator from said SFQ transition detector.

19. The digital optical receiver of claim 18, wherein the digital optical receiver further comprises a counter coupled to said oscillator.

20. The digital optical receiver of claim 18, wherein the digital optical receiver recovers the phase of the clock signal from the digital optical signal in one bit.

21. The digital optical receiver of claim 18, wherein said SFQ transition detector comprises one or more SQUIDs.

22. The digital optical receiver of claim 18, wherein said SFQ transition detector comprises a dc/SFQ converter and a confluence buffer coupled to said converter.

23. The digital optical receiver of claim 18, wherein said SFQ transition detector generates a single flux quantum signal for each transition between states of the digital optical signal.

24. The digital optical receiver of claim 18, wherein the digital optical signal comprises a plurality of bits in a sequence, each bit being in either a first state or a second state, and said receiver further comprises a data retiming circuit to convert the stream of SFQ pulses from said transition detector to a second stream of SFQ pulses having the same sequence as the digital optical signal, wherein an SFQ pulse is provided in the second stream if a corresponding bit is in the first state.

25. The digital optical receiver of claim 24, wherein the data retiming circuit comprises an NDRO cell having a SET input and a RESET input, the SET and RESET inputs coupled to the SFQ transition detector so that SFQ pulses from the SFQ transition detector will alternately set and reset the NDRO cell.

26. The digital optical receiver of claim 18, wherein said receiver further comprises one or more demultiplexors coupled to said transition detector and said clock recovery circuit.

27. A method of recovering a phase of a clock signal from digital data in the form of a stream of single flux quantum pulses comprising the steps of:

initiating an oscillator signal in a superconducting oscillator, said oscillator comprising an input for receiving the stream of single flux quantum pulses, an output for providing the clock signal, and an oscillator loop operatively coupled to said input and said output, said loop comprising a Josephson transmission line, said oscillator further comprising an initiation means operatively coupled to said oscillator loop for initiating an oscillator signal in said loop;

receiving a pulse from the stream of single flux quantum pulses at said input of said oscillator;

generating a first and a second single flux quantum pulses in said oscillator;

eliminating said oscillator signal with said first single flux quantum pulse; and replacing said oscillator signal with said second single flux quantum pulse, thereby recovering the phase of the clock signal of the digital data; and providing the clock signal at said output of said oscillator.

28. A method of recovering a phase of a clock signal from an optically transmitted digital signal, comprising the steps of:

initiating an oscillator signal in a superconducting oscillator, said oscillator comprising an input for receiving the stream of single flux quantum pulses, an output for providing the clock signal, and an oscillator loop operatively coupled to said input and said output, said loop comprising a Josephson transmission line, said oscillator further comprising an initiation means coupled to said oscillator loop for initiating an oscillator signal in said loop;

generating an electrical signal in response to the optically transmitted digital signal;

converting the electrical signal to a stream of single flux quantum pulses;

receiving a pulse from the stream of single flux quantum pulses at said input of said oscillator;

generating a first and a second single flux quantum pulses in said oscillator;

eliminating said oscillator signal with said first single flux quantum pulse; and replacing said oscillator signal with said second single flux quantum pulse, thereby recovering the phase of the clock signal of the digital data; and providing the clock signal at said output of said oscillator.

\* \* \* \* \*

UNITED STATES PATENT AND TRADEMARK OFFICE
CERTIFICATE OF CORRECTION

PATENT NO. : 5,963,351
DATED : OCTOBER 5, 1999
INVENTOR(S) : KAPLOUNENKO ET AL.

It is certified that error appears in the above-identified patent and that said Letters Patent is hereby corrected as shown below:

Col. 5, line 31: "Nb/AlO./Nb" should read --Nb/AlO$_x$/Nb--

Col. 5, line 51: "L<$\Phi_o$/I$_c$Preferably" should read --L<$\Phi_o$/I$_c$. Preferably--

Col. 7, line 25: "dc/SEQ" should read --dc/SFQ--

Col. 7, line 32: "2 n" should read --2$\pi$--

Col. 7, line 33: "SEQ" should read --SFQ--

Col. 7, line 35: "SEQ" should read --SFQ--

Col. 9, line 52: "f=f$_{cl}$-f$_{ro}$" should read --f=f$_{cl}$-f$_{ro}$--

Col. 12, line 34: "Nb/AlO,/Nb" should read --Nb/AlO$_x$/Nb--

Signed and Sealed this

Tenth Day of April, 2001

*Attest:*

NICHOLAS P. GODICI

*Attesting Officer*   Acting Director of the United States Patent and Trademark Office